(12) United States Patent
Jang

(10) Patent No.: US 7,785,936 B2
(45) Date of Patent: Aug. 31, 2010

(54) METHOD FOR REPAIR OF SEMICONDUCTOR DEVICE

(75) Inventor: Chi Hwan Jang, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/346,708

(22) Filed: Dec. 30, 2008

(65) Prior Publication Data

US 2010/0029018 A1 Feb. 4, 2010

(30) Foreign Application Priority Data

Jul. 29, 2008 (KR) ...................... 10-2008-0073933

(51) Int. Cl.
*H01L 21/82* (2006.01)
(52) U.S. Cl. ..................... 438/132; 438/9; 438/513; 438/601; 257/E21.006; 257/E21.134; 257/E21.218; 257/E21.237; 257/E21.311; 257/E21.329; 257/E21.347
(58) Field of Classification Search .............. 438/57, 438/113, 131, 132, 9, 513, 238, 381, 683, 438/687, 688, 601; 257/E21.006, 134, 218, 257/237, 311, 329, 347
See application file for complete search history.

(56) References Cited

U.S. PATENT DOCUMENTS

| | | | | |
|---|---|---|---|---|
| 5,751,646 | A | * | 5/1998 | Manning .................... 365/200 |
| 6,573,125 | B2 | * | 6/2003 | Bae ............................ 438/132 |
| 6,835,642 | B2 | * | 12/2004 | Yang et al. .................. 438/601 |
| 7,449,764 | B2 | * | 11/2008 | Kim ............................ 257/529 |
| 2007/0284577 | A1 | * | 12/2007 | Lyu et al. ....................... 257/48 |

FOREIGN PATENT DOCUMENTS

| | | |
|---|---|---|
| KR | 10-0146264 | 5/1998 |
| KR | 10-2004-0060291 | 7/2004 |
| KR | 10-2004-0102052 | 12/2004 |
| KR | 10-0746631 | 7/2007 |

* cited by examiner

*Primary Examiner*—David Nhu
(74) *Attorney, Agent, or Firm*—Marshall, Gerstein & Borun LLP

(57) ABSTRACT

The present invention relates to a method for repairing a semiconductor device. The method includes cutting a fuse without creation of residue by transforming the fuse into a nonconductor of high resistance by oxidizing the fuse by irradiating the fuse with an oxygen ion beam instead of a laser in a blowing process. The method includes transforming a fuse corresponding to a defective cell among a plurality of fuses formed in an upper portion of a semiconductor substrate into an oxide film.

18 Claims, 4 Drawing Sheets

(a)

(b)

(a)

(b)

<Prior Art>

METHOD FOR REPAIR OF SEMICONDUCTOR DEVICE

CROSS-REFERENCES TO RELATED APPLICATIONS

Priority to Korean patent application number 10-2008-0073933, filed on Jul. 29, 2008, the disclosure of which is incorporated by reference in its entirety, is claimed.

BACKGROUND OF THE INVENTION

1. Field of the Invention

The present invention relates generally to a semiconductor device, and more particularly, to a method for repairing a semiconductor device.

Generally, as semiconductor devices become highly integrated, in case of DRAM, the size of the chip increases while memory capacity increases.

2. Description of Related Technology

If even one memory cell among numerous micro memory cells of a semiconductor device has a defect as a result of the fabrication of the semiconductor device, the whole device is regarded as being defective and is discarded, thereby reducing device yield.

To overcome this problem, presently, the semiconductor device is designed with redundancy cells, which are formed in advance. A defective cell may be replaced with a redundancy cell, resulting in repair of the whole memory, and thereby improving (or not reducing) yield.

The repair operation with a redundancy cell is performed to identify a defective memory cell through a test after wafer processing and to replace the corresponding address of the defective memory cell with an address signal of a spare cell. When an address signal corresponding to a defective line is inputted, the defective line is substituted by a redundancy line.

FIG. 1 is a diagram illustrating a conventional semiconductor device. View (a) is a plane diagram illustrating a semiconductor device, and view (b) is a cross-sectional diagram taken along line A-A' of (a).

Referring to FIG. 1, a first interlayer insulating film 12 is formed on an upper portion of a semiconductor substrate 10 having a lower structure (not shown). A line type fuse 14 is formed on an upper portion of the first interlayer insulating film 12. Here, the fuse 14 has a structure on which a barrier metal layer 14a, a conductive layer 14b and an anti-reflection layer 14c are stacked. The barrier metal layer 14a and the anti-reflection layer 14c are preferably formed with a stacked structure of a Ti film and a TiN film, respectively.

The conductive layer 14b is preferably formed with the same material as a metal wiring of a cell region, for example, aluminum (Al). A fuse blowing target 16 indicates a target area to which a laser is irradiated in a blowing process. A second interlayer insulating film 18 is formed on the whole surface of the semiconductor substrate 10 in which the fuse 14 is formed.

FIG. 2 is a diagram illustrating a method of repairing of the semiconductor device illustrated in FIG. 1.

Referring to FIG. 2, a conventional blowing process irradiates a laser into the fuse 14 corresponding to a defective cell to cut. However, a crack can be generated in the first interlayer insulating film 12 due to a laser energy in the blowing process.

A residue B of the conductive layer 14c or the barrier metal layer 14a can remain in a place where the crack is generated, such that it can not be determined that the fuse 14 is cut, even in case of cutting.

Accordingly, there is a problem of generating device failure as a repair of the defective cell is not successfully performed. Moreover, the blowing process using a laser energy performs cutting by melting, vaporizing, or exploding the fuse 14 such that it can have an associated problem of generating device failure due to the damage of the adjacent fuse 14.

BRIEF SUMMARY OF THE INVENTION

Various embodiments of the present invention are directed at providing a method for repair of a semiconductor device, which includes transforming at least a portion of a fuse corresponding to a defective cell, among a plurality of fuses formed over a semiconductor substrate, into an oxide film.

According to an embodiment of the present invention, the fuse preferably includes a barrier metal layer and a conductive layer. Preferably, the conductive layer is formed with a material selected from the group consisting of Al, W, Cu, Pt, polysilicon, $WSi_x$, Ti, TiN and TaN. The fuse can further include an anti-reflection layer over the conductive layer. The barrier metal layer and the anti-reflection layer preferably include a stacked structure of a Ti film and a TiN film, respectively. The fuse is preferably formed with a thickness in a range of about 100 Å to about 5000 Å.

According to an embodiment of the present invention, transforming at least a portion of the fuse corresponding to a defective cell is performed by irradiating an oxygen ion beam on the fuse. Preferably, the oxygen ion beam is irradiated with an acceleration energy in a range of about 10 keV to about 1 MeV and optionally further preferable with a dose in a range of about 1.0E21 to about 6.0E23. The oxygen ion beam can be irradiated by sequentially varying the acceleration energy. The method can include irradiating the oxygen ion beam with a first acceleration energy and then with a second acceleration energy less than the first acceleration energy. The oxygen ion beam can be irradiated with a single acceleration energy. The oxygen ion beam is preferably irradiated through a nozzle. The oxygen ion beam is preferably irradiated one or two times. The oxygen ion beam is preferably irradiated with an inert gas. Preferably, the spot size of the oxygen ion beam is in a range of about 30 nm to about 30000 nm.

According to an embodiment of the present invention, a whole of the fuse can be transformed into the oxide film. Preferably, only a portion of the fuse is transformed into the oxide film. Preferably, a resistance of the fuse which is transformed into the oxide film is in a range of about 1 kΩ to about 100 kΩ.

BRIEF DESCRIPTION OF THE DRAWINGS

For a more complete understanding of the disclosure, reference should be made to the following detailed description and accompanying drawings.

Figure 1:
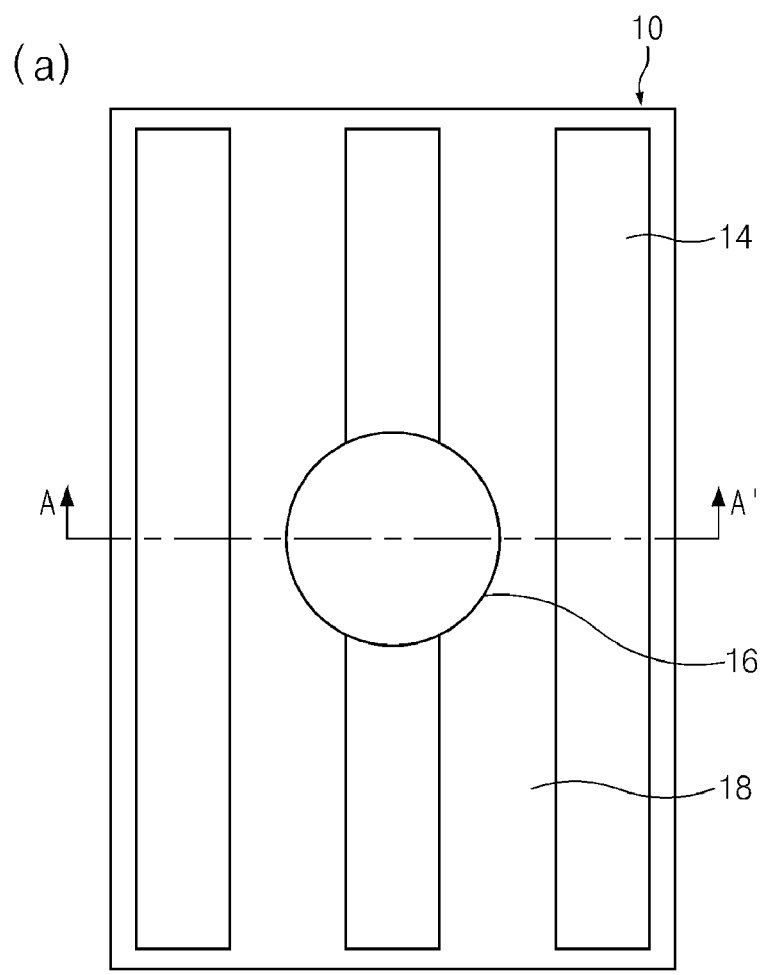
FIG. 1 is a diagram illustrating a conventional semiconductor device.
Figure 1:
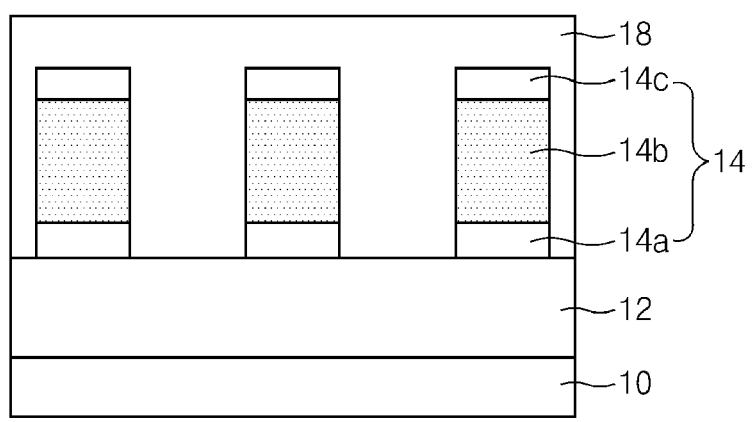
Figure 2:
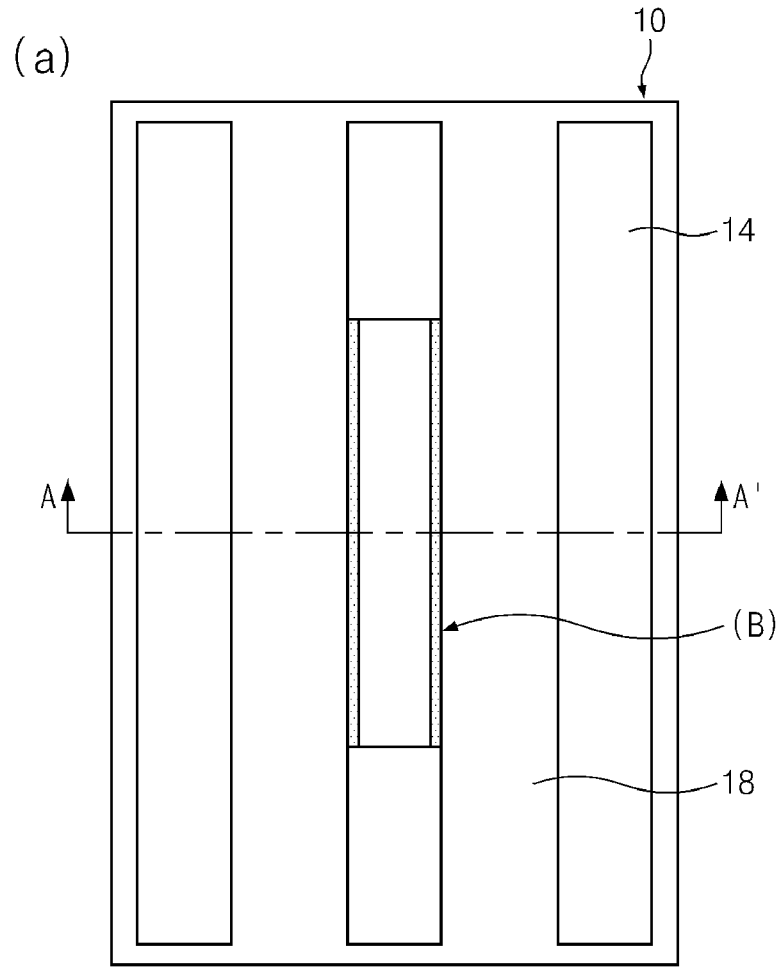
FIG. 2 is a diagram illustrating a conventional method of repairing of the semiconductor device illustrated in FIG. 1.
Figure 2:
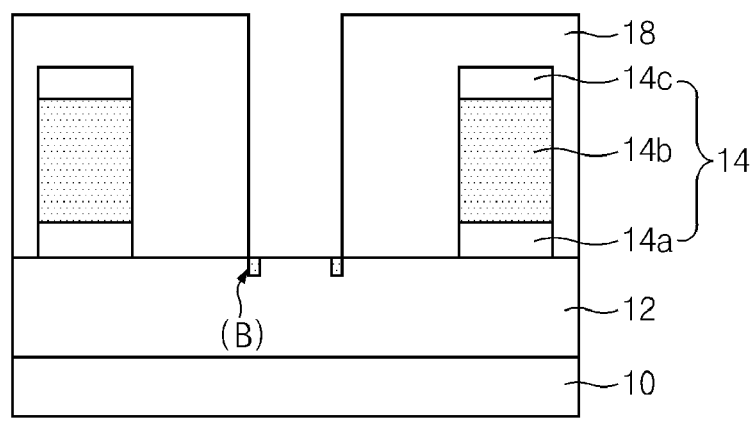

While the disclosed method is susceptible of embodiments in various forms, specific embodiments are illustrated in the drawings (and will hereafter be described), with the understanding that the disclosure is intended to be illustrative, and

DESCRIPTION OF EMBODIMENTS

Figure 3:
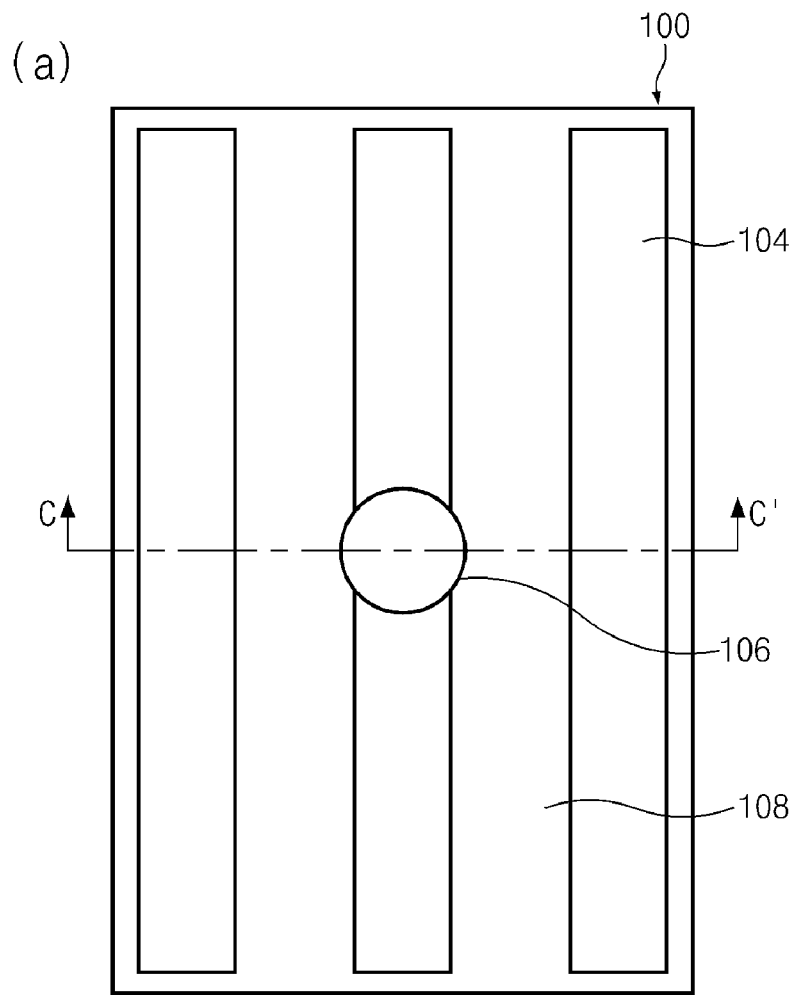
FIG. 3 is a diagram illustrating a semiconductor device according to the invention.
Figure 3:
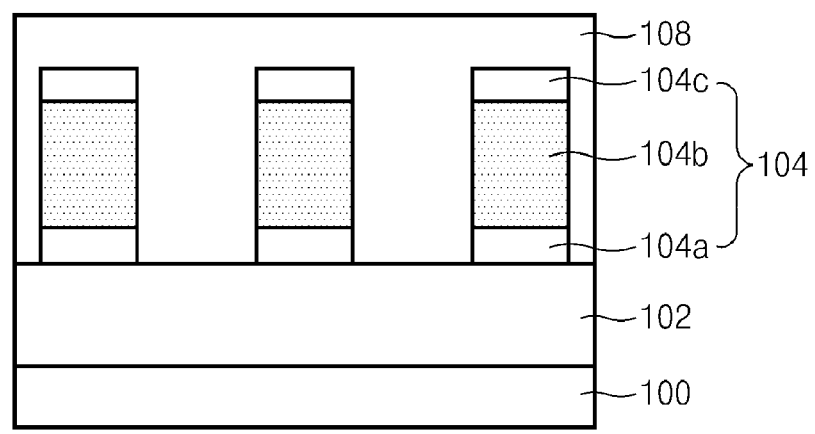

FIG. 3 is a diagram illustrating a semiconductor device according to the invention. View (a) is a plane diagram illustrating the semiconductor device, and view (b) is a cross-sectional diagram taken along line C-C' of (a).

Referring to FIG. 3, a first interlayer insulating film 102 is formed over a semiconductor substrate 100 having a lower structure (not shown). A line type fuse 104 is formed over the first interlayer insulating film 102. A second interlayer insulating film 108 is formed over the semiconductor substrate 100 in which the fuse 104 is formed.

In this embodiment, the fuse 104 has a structure on which a barrier metal layer 104a, a conductive layer 104b and an anti-reflection layer 104c are stacked. In this embodiment, the barrier metal layer 104a and the anti-reflection layer 104c are formed with a stacked structure of a Ti film and a TiN film, respectively.

The conductive layer 104b is formed with a material selected from the group consisting of aluminum (Al), tungsten (W), copper (Cu), platinum (Pt), polysilicon, tungsten polysilicon ($WSi_x$), titanium (Ti), titanium nitride (TiN), and tantalum nitride (TaN). It is preferable that the thickness of the fuse 104 is in a range of about 100 Å to about 5000 Å. A fuse blowing part 106 indicates an area to which an oxygen ion beam is irradiated in the blowing process. A spot size of the oxygen ion beam is smaller than the spot size of the laser illustrated in FIG. 1.

In the meantime, in the embodiment of the present invention, it is exemplified that the fuse 104 has a stacked structure of the barrier metal layer 104a, the conductive layer 104b and the anti-reflection layer 104c. However, it is not limitative and the invention can be applied if the fuse 104 is formed with a plate layer of a cell region, or even if the fuse 104 is formed only with the barrier metal layer 104a and the conductive layer 104b. If the fuse 104 is formed with the barrier metal layer 104a and the conductive layer 104b, and without an anti-reflection layer 104c, the fuse 104 can be formed to be exposed on the upper portion of the conductive layer without an insulating layer.

Figure 4:
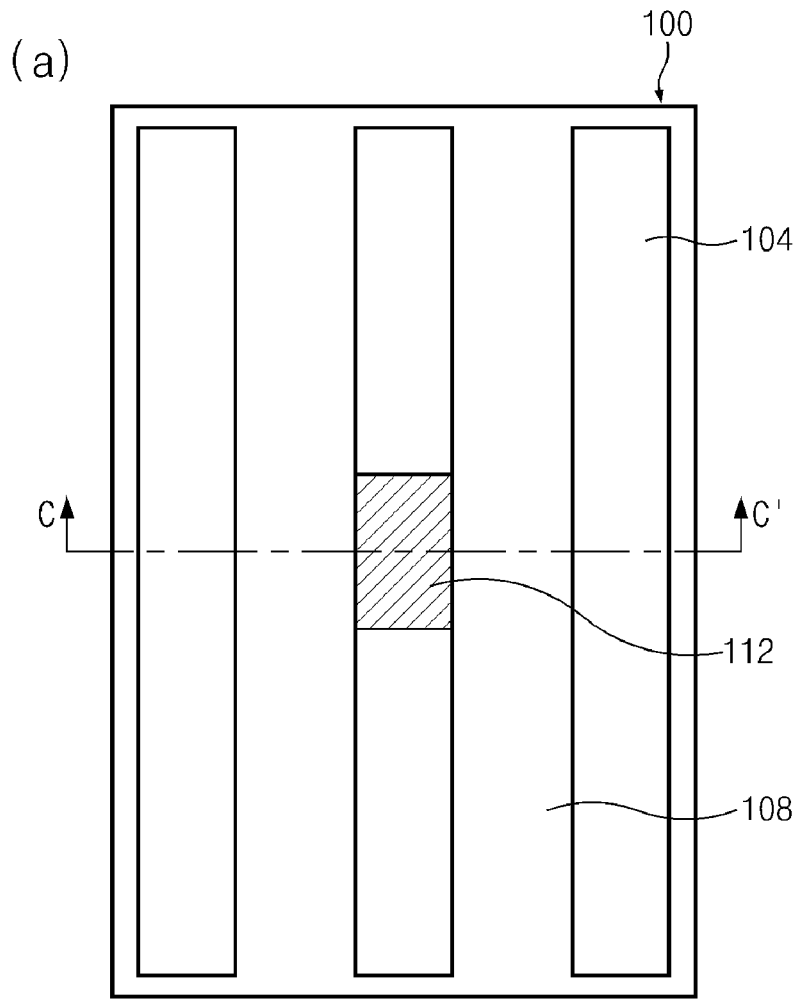
FIG. 4 is a diagram illustrating a method of repairing of the semiconductor device illustrated in FIG. 3.
Figure 4:
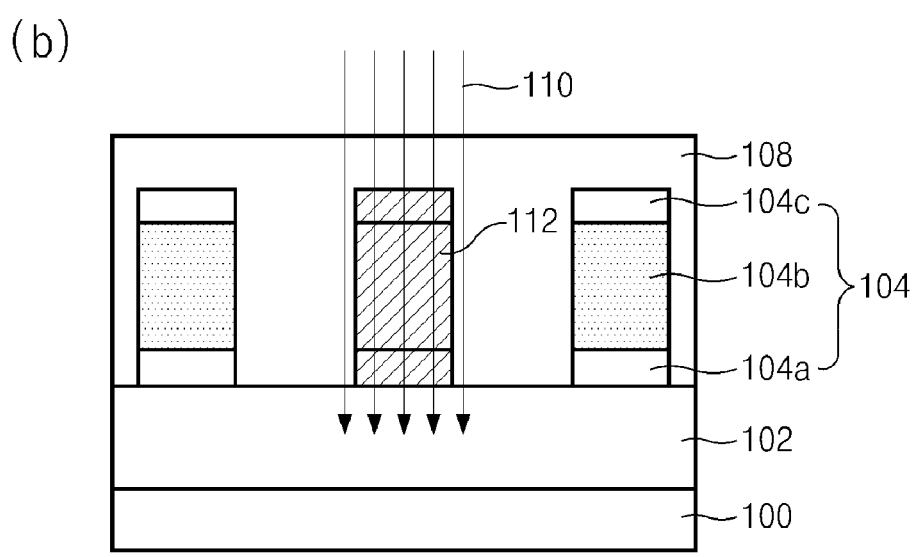

FIG. 4 is a diagram illustrating a method for repair of the semiconductor device illustrated in FIG. 3.

Referring to FIG. 4, the repairing method of the invention irradiates an oxygen ion beam 110 on the fuse 104 corresponding to a defective cell to change the fuse 104 into an oxide film 112. For example, the conductive layer 104b is transformed into $Al_2O_3$ or $Al_3O_5$ when the conductive layer 104b is formed with Al.

If the conductive layer 104b is formed with tungsten (W), copper (Cu), platinum (Pt), titanium (Ti), titanium nitride (TiN), or tantalum nitride (TaN), then, the layer is transformed into $WSiO_x$, $CuO_2$, PtO, $TiO_x$, TiON, or TaON, respectively. Similarly, the barrier metal layer 104a and the anti-reflection layer 104c (if present) are transformed into corresponding portions of the oxide film 112.

Here, the oxygen ion beam 110 can obtain an oxygen ion by injecting $O_2$, $O_3$, or a gas including an oxygen ion with an inert gas into a chamber, and plasma discharging to separate the oxygen ion and electrons. The inert gas preferably includes a gas such as helium (He) or argon (Ar). A gas which does not react to $O_2$ or $O_3$ gas can be applied in the invention without a limitation.

It is preferable that the acceleration energy is in a range of from 10 keV to 1 MeV and optionally further preferable that the dose is in a range of about 1.0E21 to about 6.0E23 in the irradiating of the oxygen ion beam 110. The acceleration energy of the oxygen ion beam 110 can be controlled according to the thickness or material of the fuse 104. For example, the thicker the thickness of the fuse 104 becomes, the more the acceleration energy has to be increased. Further, the higher specific densities of the materials serving as the fuse 104 are, the more the acceleration energy has to be increased. The frequency of the irradiating oxygen ion beam 110 can be one or two times.

In one embodiment, the irradiating process of the oxygen ion beam 110, the acceleration energy is sequentially varied in a range of about 10 keV to about 1 MeV such that a whole thickness of the fuse 104 can be changed into the oxide film 112. For example, the oxygen ion is irradiated to a lower portion of the fuse 104 when the acceleration energy is relatively high at first. Thereafter, when the acceleration energy is gradually lowered, the oxygen ion is irradiated while going up from the lower portion to a middle portion, and up to an upper portion.

Then, the whole thickness of the fuse 104 can be oxidized. In another embodiment, the oxygen ion beam 110 can be irradiated with a single energy such that the whole thickness of the fuse 104 can be changed into the oxide film 112. It is preferable that the oxygen ion beam 110 is irradiated through a nozzle in order that the oxygen ion is concentrated. The fuse 104 can be sputtered by using the oxygen ion beam 110. If an inert gas is added to the oxygen ion beam 110, the etch rate of the fuse 104 can be increased. The inert gas preferably includes a gas such as He or Ar. A gas which does not react to $O_2$ or $O_3$ gas can be applied in the invention without a limitation. In this case, the thickness of the fuse 104 is decreased while being transformed into the oxide film 112. Therefore, the conversion rate can be increased.

Moreover, the fuse blowing part 106 can be a middle portion of the fuse 104 like conventional technology (See FIGS. 1(a) and 3(a)). However, it is not limitative and thus it can be an edge part of the fuse 104 (e.g., upper or lower portion of the fuse as illustrated in FIG. 3(a)) or the whole of the fuse 104. In addition, the location of the fuse blowing target 106 can be arbitrarily selected.

Accordingly, it is not necessary that the length of the fuse 104 in a major axis direction has a long length. The spot size of the oxygen ion beam 110 can be as small as about ¹⁄₁₀ in comparison with the laser spot size used in the prior method such that the length of the fuse 104 in a minor axis direction can be reduced, thus, the method is advantageous for highly integrated devices.

In this way, if a part or a whole of the fuse 104 is changed into the oxide film 112, then, the resistance of the fuse 104 is enhanced to a value in a range of about 0.25Ω to about 100 kΩ. That is, the fuse 104 has a high resistance, which is physically equivalent to a state of cutting. Therefore, the fuse 104 is cut without changing the form. There remains no residue, or there is no damage on the adjacent fuse 104 such that a device failure can be prevented.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. While the present invention has been described with respect to the specific embodiments, it will be apparent to those skilled in the art that various changes and modifications may be made without departing from the spirit and scope of the invention as defined in the following claims.

What is claimed is:

1. A method for repair of a semiconductor device comprising:
   forming a plurality of fuses over a semiconductor substrate; and
   irradiating an oxygen ion beam on a fuse corresponding to a defective cell, to transform at least a portion of the fuse corresponding to the defective cell into an oxide film.

2. The method for repair of a semiconductor device according to claim 1, wherein the fuse comprises a barrier metal layer and a conductive layer.

3. The method for repair of a semiconductor device according to claim 2, wherein the conductive layer is formed with a material selected from the group consisting of Al, W, Cu, Pt, polysilicon, $WSi_x$, Ti, TiN, and TaN.

4. The method for repair of a semiconductor device according to claim 2, wherein the fuse further comprises an anti-reflection layer over the conductive layer.

5. The method for repair of a semiconductor device according to claim 4, wherein the barrier metal layer and the anti-reflection layer comprise a stacked structure of a Ti film and a TiN film, respectively.

6. The method for repair of a semiconductor device according to claim 1, wherein the fuse is formed with a thickness in a range of about 100 Å to about 5000 Å.

7. The method for repair of a semiconductor device according to claim 1, wherein the oxygen ion beam is irradiated with an acceleration energy in a range of about 10 keV to about 1 MeV.

8. The method for repair of a semiconductor device according to claim 1, wherein the oxygen ion beam is irradiated with a dose in a range of about 1.0E21 to about 6.0E23.

9. The method for repair of a semiconductor device according to claim 1, comprising sequentially varying an acceleration energy of the irradiating oxygen ion beam.

10. The method for repair of a semiconductor device according to claim 9, comprising irradiating the oxygen ion beam with a first acceleration energy and then with a second acceleration energy less than the first acceleration energy.

11. The method for repair of a semiconductor device according to claim 1, comprising irradiating the oxygen ion beam with a single acceleration energy.

12. The method for repair of a semiconductor device according to claim 1, comprising irradiating the oxygen ion beam through a nozzle.

13. The method for repair of a semiconductor device according to claim 1, comprising irradiating the oxygen ion beam one or two times.

14. The method for repair of a semiconductor device according to claim 1, comprising irradiating the oxygen ion beam with an inert gas.

15. The method for repair of a semiconductor device according to claim 1, wherein a spot size of the oxygen ion beam is in a range of about 30 nm to about 30000 nm.

16. The method for repair of a semiconductor device according to claim 1, wherein the whole of the fuse is transformed into the oxide film.

17. The method for repair of a semiconductor device according to claim 1, wherein only a portion of the fuse is transformed into the oxide film.

18. The method for repair of a semiconductor device according to claim 1, wherein a resistance of the fuse which is transformed into the oxide film is in a range of about 1 kΩ to about 100 kΩ.

* * * * *